US007468640B2

(12) United States Patent
Nosaka

(10) Patent No.: US 7,468,640 B2
(45) Date of Patent: Dec. 23, 2008

(54) BALANCED SPLITTER

(75) Inventor: Koji Nosaka, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 542 days.

(21) Appl. No.: 10/570,906

(22) PCT Filed: Jan. 13, 2005

(86) PCT No.: PCT/JP2005/000275

§ 371 (c)(1), (2), (4) Date: Mar. 6, 2006

(87) PCT Pub. No.: WO2005/076404

PCT Pub. Date: Aug. 18, 2005

(65) Prior Publication Data

US 2008/0266020 A1 Oct. 30, 2008

(30) Foreign Application Priority Data

Feb. 6, 2004 (JP) ............................. 2004-031390

(51) Int. Cl.
*H03H 7/42* (2006.01)
*H01F 27/28* (2006.01)

(52) U.S. Cl. .......................................... 333/26; 333/25

(58) Field of Classification Search .................. 333/25, 333/26; 336/170
See application file for complete search history.

(56) References Cited

U.S. PATENT DOCUMENTS 5,424,694 A 6/1995 Maloratsky et al.
6,201,439 B1 3/2001 Ishida et al.
6,448,864 B1 9/2002 Hiroshima et al.
6,563,395 B2 5/2003 Ishida et al.
6,690,249 B2 2/2004 Ishida et al.
6,693,499 B2 * 2/2004 Goyette et al. .............. 333/118
6,714,094 B1 * 3/2004 Gill ............................ 333/26

(Continued)

FOREIGN PATENT DOCUMENTS

EP 0 869 574 A2 10/1998

(Continued)

OTHER PUBLICATIONS

Official communication issued in counterpart Japanese Application No. 2005-517635, mailed on Oct. 9, 2007.

(Continued)

*Primary Examiner*—Dean O Takaoka
(74) *Attorney, Agent, or Firm*—Keating & Bennett, LLP

(57) ABSTRACT

A balanced splitter has six ¼ strip lines. The first and third strip lines are electromagnetically coupled to each other to form a coupler. The second and fourth strip lines are electromagnetically coupled to each other to form a coupler. The first and fifth strip lines are electromagnetically coupled to each other to form a coupler. The second and sixth strip lines are electromagnetically coupled to each other to form a coupler. The first and second strip lines are connected in series to form an unbalanced line, the third and fourth strip lines form a first balanced line, and the fifth and sixth strip lines form a second balanced line. First and second resistors are electrically connected between a first balanced terminal and a second balanced terminal, and between another first balanced terminal and another second balanced terminal, respectively.

14 Claims, 9 Drawing Sheets

U.S. PATENT DOCUMENTS

| | | | |
|---|---|---|---|
| 6,803,837 | B2 | 10/2004 | Ishida et al. |
| 2004/0061568 | A1 | 4/2004 | Ishida et al. |

FOREIGN PATENT DOCUMENTS

| | | | |
|---|---|---|---|
| EP | 1 134 834 | A1 | 9/2001 |
| EP | 1184931 | A1 | 3/2002 |
| JP | 08-191016 | | 7/1996 |
| JP | 10-335911 | | 12/1998 |
| JP | 11-214943 | | 8/1999 |
| JP | 11-261313 | | 9/1999 |
| JP | 2000-188218 | | 7/2000 |
| JP | 2000-278149 | | 10/2000 |
| JP | 2001-094316 | | 4/2001 |
| JP | 2001-168607 | | 6/2001 |
| JP | 2001-211010 | | 8/2001 |
| JP | 2002-111328 | A | 4/2002 |
| JP | 2002-217036 | | 8/2002 |
| JP | 2002-217615 | | 8/2002 |
| JP | 2002-271111 | A | 9/2002 |
| JP | 2002-329611 | | 11/2002 |
| JP | 2002-344276 | A | 11/2002 |
| JP | 2003-198221 | | 7/2003 |

OTHER PUBLICATIONS

Yamamoto, "Tsuushin yo Maikuroha Kairo (Microwave Circuits for Communications)," Corona Publishing Co., Ltd., 1981, pp. 63-64.

International Search Report for PCT Application No. PCT/JP2005/000275, mailed May 17, 2005.

* cited by examiner

BALANCED SPLITTER

BACKGROUND OF THE INVENTION

1. Field of the Invention

The present invention relates to a balanced splitter, in particular, a balanced splitter for use in mobile communication devices, or the like.

2. Description of the Related Art

With the trend toward higher signal frequency, an increasing number of communication devices use a balanced signal for the purpose of improved anti-noise characteristics, and the like. For this reason, there is a need for an unbalanced/balanced converter for converting an unbalanced signal into a balanced signal. Further, there is also a need for a splitter for splitting a signal into two signals depending on the intended applications. Accordingly, there is a growing need for a component combining the functions of both the converter and the splitter, that is, an "unbalanced output/balanced input splitter (balanced splitter)" for splitting a single unbalanced signal into two balanced signals.

As shown in FIG. 13, an unbalanced output/balanced input splitter (balanced splitter) 1 is obtained by combining one unbalanced output/unbalanced input splitter (a generally known splitter) 2 that splits an unbalanced signal input from an unbalanced terminal 5 into two signals, and two unbalanced/balanced converters (so-called baluns) 3, 4 that convert each of the two split unbalanced signals into a balanced signal. The balanced signals exiting the unbalanced/balanced converters 3, 4 are output from first balanced terminals 6*a*, 6*b* and second balanced terminals 7*a*, 7*b*, respectively.

Alternatively, the unbalanced output/balanced input splitter (balanced splitter) is obtained by combining one unbalanced/balanced converter (so-called balun), which converts an unbalanced signal into a balanced signal, with one balanced input/balanced output splitter that splits the one balanced signal output from the unbalanced/balanced converter into two signals.

Known unbalanced/balanced converters include those described in JP 2001-94316 A and JP 2001-168607 A. Based on JP 2001-94316 A and JP 2001-168607 A, the unbalanced output/balanced input splitter (balanced splitter) 1 shown in the block circuit diagram of FIG. 13 is illustrated in more detail in the electric circuit diagram of FIG. 14. The balanced splitter 1 is composed of ten ¼ wavelength strip lines 11 to 20 and one resistor R.

However, when the balanced splitter 1 is constructed by combining the splitter 2 and the baluns 3, 4, each of which are separate components, a problem arises in that the number of components increases. Further, as shown in FIG. 14, when the separate components 2 to 4 are simply integrated into one component, the internal circuit configuration of the component becomes rather complex leading to such problems as high manufacturing cost and large insertion loss.

SUMMARY OF THE INVENTION

In order to overcome the problems described above, preferred embodiments of the present invention provide a balanced splitter having a simple miniaturized circuit configuration.

A balanced splitter according to a preferred embodiment of the present invention includes an unbalanced line including a first strip line and a second strip line that are connected in series; an unbalanced terminal electrically connected to the first strip line of the unbalanced line; a first balanced line including a third strip line electromagnetically coupled to the first strip line, and a fourth strip line electromagnetically coupled to the second strip line; a first balanced terminal including two terminals, a first and a second of the two terminals being electrically connected to the third strip line and the fourth strip line of the first balanced line, respectively; a second balanced line including a fifth strip line electromagnetically coupled to the first strip line, and a sixth strip line electromagnetically coupled to the second strip line; a second balanced terminal including two terminals, a first and a second of the two terminals being electrically connected to the fifth strip line and the sixth strip line of the second balanced line, respectively; a first resistor electrically connected between the first balanced terminal connected to the third strip line and the second balanced terminal connected to the fifth strip line; and a second resistor electrically connected between the first balanced terminal connected to the fourth strip line and the second balanced terminal connected to the sixth strip line.

A balanced splitter according to another preferred embodiment of the present invention includes a first strip line having a first end and a second end; a second strip line having a first end and a second end, the second end of the second strip line being electrically connected to the second end of the first strip line; an unbalanced terminal electrically connected to the first end of the first strip line; a third strip line having a first end and a second end, the first end of the third strip line being electrically connected to a ground; a fourth strip line having a first end and a second end, the first end of the fourth strip line being electrically connected to the ground; a first balanced terminal including two terminals, a first and a second of the two terminals being electrically connected to the second end of the third strip line and the second end of the fourth strip line, respectively; a fifth strip line having a first end and a second end, the first end of the fifth strip line being electrically connected to the ground; a sixth strip line having a first end and a second end, the first end of the sixth strip line being electrically connected to the ground; a second balanced terminal including two terminals, a first and a second of the two terminals being electrically connected to the second end of the fifth strip line and the second end of the sixth strip line, respectively; a first resistor electrically connected between the second end of the third strip line and the second end of the fifth strip line; and a second resistor electrically connected between the second end of the fourth strip line and the second end of the sixth strip line; wherein the first end of the second strip line is an open end, and the first strip line and the third strip line are electromagnetically coupled to each other such that the first ends and the second ends thereof are opposed to each other, the first strip line and the fifth strip line are electromagnetically coupled to each other such that the first ends and the second ends thereof are opposed to each other, the second strip line and the fourth strip line are electromagnetically coupled to each other such that the first ends and the second ends thereof are opposed to each other, and the second strip line and the sixth strip line are electromagnetically coupled to each other such that the first ends and the second ends thereof are opposed to each other.

Alternatively, a balanced splitter according to another preferred embodiment of the present invention includes a first strip line having a first end and a second end; a second strip line having a first end and a second end, the second end of the second strip line being electrically connected to the second end of the first strip line; an unbalanced terminal electrically connected to the first end of the first strip line; a third strip line having a first end and a second end, the second end of the third strip line being electrically connected to a ground; a fourth strip line having a first end and a second end, the second end being electrically connected to the ground; a first balanced terminal including two terminals, a first and a second of the two terminals being electrically connected to the first end of the third strip line and the first end of the fourth strip line, respectively; a fifth strip line having a first end and a second end, the second end being electrically connected to the ground; a sixth strip line having a first end and a second end, the second end of the sixth strip line being electrically connected to the ground; a second balanced terminal including two terminals, a first and a second of the two terminals being electrically connected to the first end of the fifth strip line and the first end of the sixth strip line, respectively; a first resistor electrically connected between the first end of the third strip line and the first end of the fifth strip line; and a second resistor electrically connected between the first end of the fourth strip line and the first end of the sixth strip line; wherein the first end of the second strip line is electrically connected to the ground, and the first strip line and the third strip line are electromagnetically coupled to each other such that the first ends and the second ends thereof are opposed to each other, the first strip line and the fifth strip line are electromagnetically coupled to each other such that the first ends and the second ends thereof are opposed to each other, the second strip line and the fourth strip line are electromagnetically coupled to each other such that the first ends and the second ends thereof are opposed to each other, and the second strip line and the sixth strip line are electromagnetically coupled to each other such that the first ends and the second ends thereof are opposed to each other.

Herein, the first, second, third, fourth, fifth, and the sixth strip lines are preferably ¼ wavelength strip lines.

Further, a resistance value of the first resistor and a resistance value of the second resistor are each about ½ of the sum of a balanced line characteristic impedance value of the first balanced terminal and a balanced line characteristic impedance value of the second balanced terminal.

According to the above-described construction, an unbalanced signal entering from the unbalanced terminal propagates by way of the first strip line and the second strip line. Then, through electromagnetic coupling the third strip line and the fifth strip line with the first strip line, and through electromagnetic coupling the fourth strip line and the sixth strip line with the second strip line, the one unbalanced signal is converted into two balanced signals, and those balanced signals are extracted from the first balanced terminal and the second balanced terminal.

Further, in a balanced splitter according to the above preferred embodiments, first, second, third, fourth, fifth, and sixth strip lines, and ground electrodes are laminated on top of one another through intermediate dielectric layers to define a laminate; and an unbalanced terminal, a first balanced terminal and a second balanced terminal, and a ground terminal are extended to a surface of the laminate, the first balanced terminal and the second balanced terminal each including two terminals; the unbalanced terminal is electrically connected to the first strip line of an unbalanced line including the first strip line and the second strip line that are connected in series; first and second of the first balanced terminals are electrically connected to the third strip line and the fourth strip line of a first balanced line, respectively, the first balanced line including the third strip line electromagnetically coupled to the first strip line, and the fourth strip line electromagnetically coupled to the second strip line; the first and second of the second balanced terminals are electrically connected to the fifth strip line and the sixth strip line of a second balanced line, respectively, the second balanced line including the fifth strip line electromagnetically coupled to the first strip line, and the sixth strip line electromagnetically coupled to the second strip line; a first resistor is electrically connected between the first balanced terminal connected to the third strip line and the second balanced terminal connected to the fifth strip line; and a second resistor is electrically connected between the first balanced terminal connected to the fourth strip line and the second balanced terminal connected to the sixth strip line. With the above-described construction, a laminated balanced splitter can be easily obtained.

A construction may be utilized in which, with respect to a laminating direction of the dielectric layers, the ground electrodes are respectively arranged in an upper layer portion, a middle layer portion, and a lower layer portion of the laminate; the first, third, and fifth strip lines are arranged between the ground electrode in the upper layer portion and the ground electrode in the middle layer portion; and the second, fourth, and sixth strip lines are arranged between the ground electrode in the middle layer portion and the ground electrode in the lower layer portion. Conversely, a construction may also be utilized in which the second, fourth, and sixth strip lines are arranged between the ground electrode in the upper layer portion and the ground layer in the middle layer portion; and the first, third, and fifth strip lines are arranged between the ground electrode in the middle layer portion and the ground electrode in the lower layer portion.

Further, the surface of the laminate may be provided with an external terminal for electrically connecting one of the first resistor and the second resistor, the first resistor and the second resistor being arranged on the surface of the laminate.

According to the present preferred embodiments, the internal circuit configuration of the components is simplified, thereby making it possible to obtain a compact balanced splitter having low manufacturing cost and small insertion loss.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinbelow, preferred embodiments of a balanced splitter according to the present invention will be described with reference to the accompanying drawings.

Preferred Embodiment 1

Figure 1:
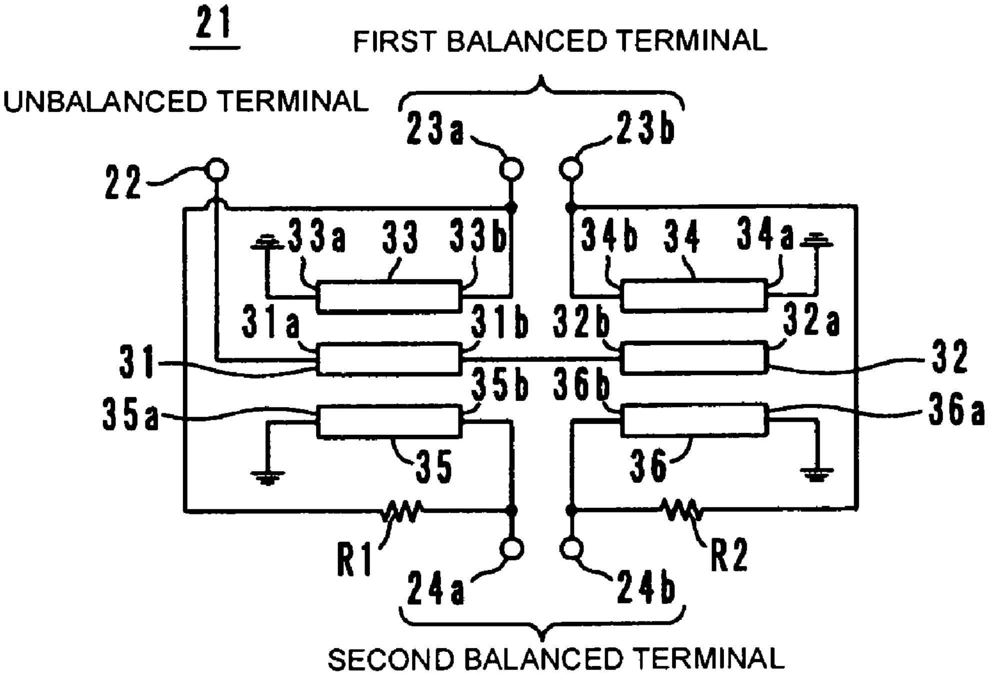
FIG. 1 is a block diagram of a balanced splitter according to a first preferred embodiment of the present invention.

As shown in FIG. 1, a balanced splitter 21 has ¼ strip lines 31, 32, 33, 34, 35, 36. Each of the strip lines 31, 32, 33, 34, 35, 36 has first end 31*a*, 32*a*, 33*a*, 34*a*, 35*a*, 36*a* and second end 31*b*, 32*b*, 33*b*, 34*b*, 35*b*, 36*b*, respectively. The first end 31*a* of the strip line 31 is electrically connected to an unbalanced terminal 22, and the second end thereof 31*b* is electrically connected to the second end 32*b* of the strip line 32. The first end 32*a* of the strip line 32 is an open end. The first end 33*a* of the strip line 33 is grounded, and the second end 33*b* thereof is electrically connected to a first balanced terminal 23*a*. The first end 34*a* of the strip line 34 is grounded, and the second end 34*b* thereof is electrically connected to a first balanced terminal 23*b*. The first end 35*a* of the strip line 35 is grounded, and the second end 35*b* thereof is electrically connected to a second balanced terminal 24*a*. The first end 36*a* of the strip line 36 is grounded, and the second end 36*b* thereof is electrically connected to a second balanced terminal 24*b*.

Further, the first and second ends of each of the strip lines 31, 33 are opposed to each other so that the strip lines 31, 33 become electrically coupled, thereby forming a coupler. Further, the first and second ends of each of the strip lines 32, 34 are opposed to each other so that the strip lines 32, 34 become electrically coupled, thereby forming a coupler.

Likewise, the first and second ends of each of the strip lines 31, 35 are opposed to each other so that strip lines 31, 35 become electrically coupled, thereby forming a coupler. Further, the first and second ends of each of the strip lines 32, 36 are opposed to each other so that the strip lines 32, 36 become electrically coupled, thereby forming a coupler.

The strip lines 31 and 32 are connected in series to form an unbalanced line, the strip lines 33 and 34 form a first balanced line, and the strip lines 35 and 36 form a second balanced line.

Further, resistors R1 and R2 are electrically connected between the first balanced terminal 23*a* and the second balanced terminal 24*a*, and between the first balanced terminal 23*b* and the second balanced terminal 24*b*, respectively. The values of the resistors R1, R2 are respectively designed to be about ½ of the sum of the balanced line characteristic impedance value of the first balanced terminals 23*a*, 23*b* and the balanced line characteristic impedance value of the second balanced terminals 24*a*, 24*b*.

The balanced splitter 21 is an "unbalanced input/balanced output splitter" for splitting a single unbalanced signal into two balanced signals. That is, an unbalanced signal input from the unbalanced terminal 22 propagates by way of the strip line 31 and the strip line 32. Then, the strip line 31 becomes electrically coupled through electromagnetic coupling with the strip lines 33, 35, and the strip line 32 becomes electrically coupled with the strip lines 34, 36, the single unbalanced signal is converted into two balanced signals, which are output from the first balanced terminals 23*a*, 23*b* and the second balanced terminals 24*a*, 24*b*.

Figure 13:
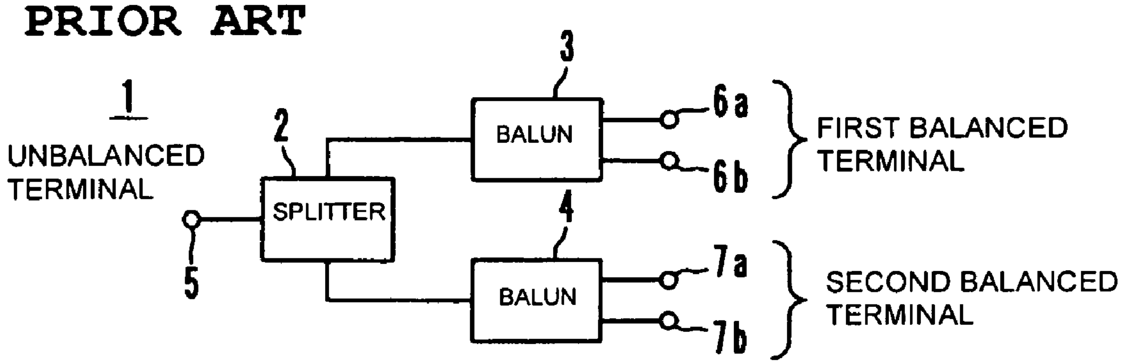
FIG. 13 PRIOR ART
FIG. 13 is a block diagram of a conventional balanced splitter.
Figure 14:
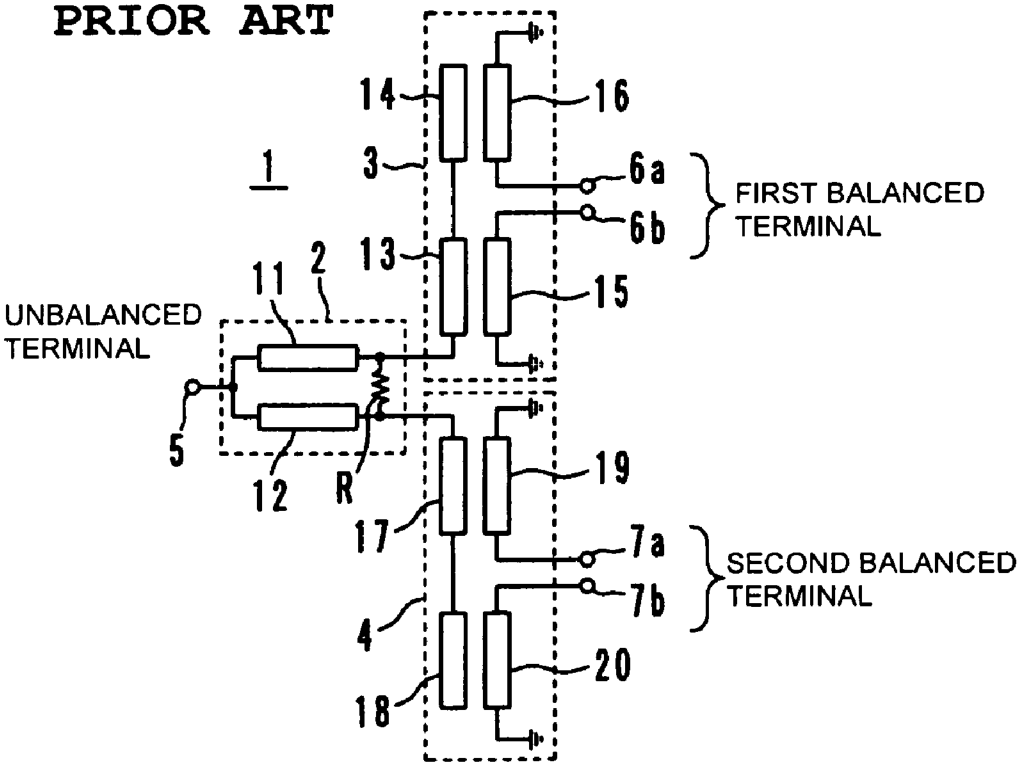
FIG. 14 PRIOR ART
FIG. 14 is an electric circuit diagram of the balanced splitter shown in FIG. 13.

In contrast to the conventional balanced splitter 1 shown in FIG. 13, which involves an increase in overall insertion loss due to the insertion loss of the splitter 2 and the insertion losses of the baluns 3, 4, the balanced splitter 21 described above, can achieve a reduction in insertion loss. Furthermore, the balanced splitter 21, which preferably includes the six ¼ wavelength strip lines 31 to 36 and the two resistors R1, R2, can be composed by using a smaller number of components as compared with the conventional balanced splitter 1 shown in FIG. 14, thereby making it possible to achieve miniaturization.

Preferred Embodiment 2

Figure 2:
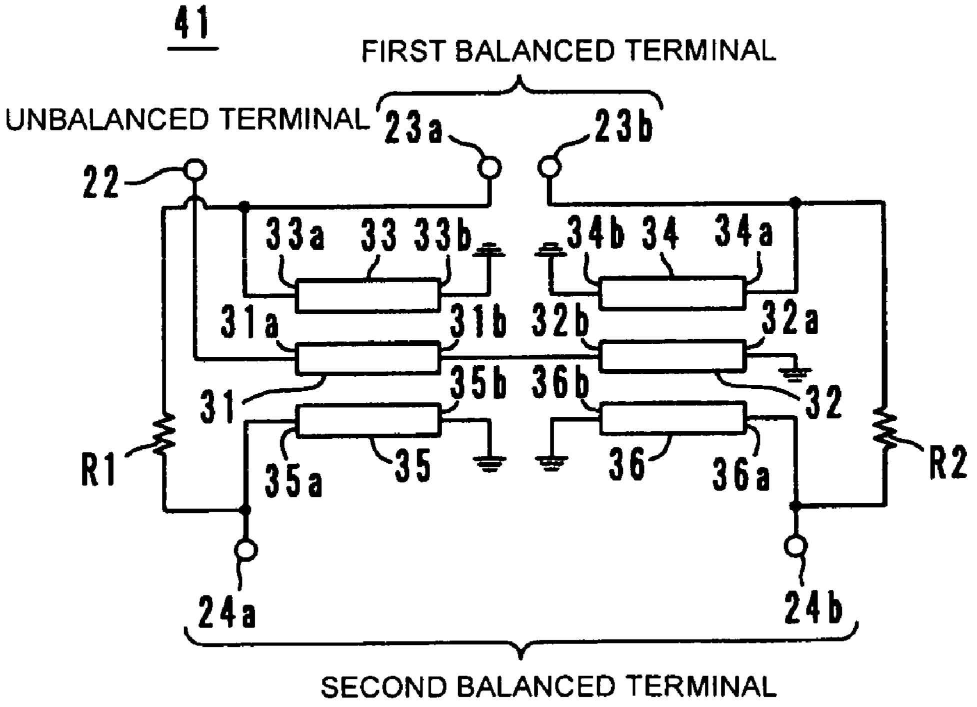
FIG. 2 is a block diagram of a balanced splitter according to a second preferred embodiment of the present invention.

As shown in FIG. 2, a balanced splitter 41 includes ¼ strip lines 31, 32, 33, 34, 35, 36. Each of the strip lines 31, 32, 33, 34, 35, 36 has a first end 31*a*, 32*a*, 33*a*, 34*a*, 35*a*, 36*a* and a second end 31*b*, 32*b*, 33*b*, 34*b*, 35*b*, 36*b*, respectively. The first end 31*a* of the strip line 31 is electrically connected to an unbalanced terminal 22, and the second end 31*b* thereof is electrically connected to the second end 32*b* of the strip line 32. The first end 32*a* of the strip line 32 is grounded. The second end 33*b* of the strip line 33 is grounded, and the first end 33*a* thereof is electrically connected to a first balanced terminal 23*a*. The second end 34*b* of the strip line 34 is grounded, and the first end 34*a* thereof is electrically connected to a first balanced terminal 23*b*. The second end 35*b* of the strip line 35 is grounded, and the first end 35*a* thereof is electrically connected to a second balanced terminal 24*a*. The second end 36*b* of the strip line 36 is grounded, and the first end 36*a* thereof is electrically connected to a second balanced terminal 24*b*.

Further, the first and second ends of each of the strip lines 31, 33 are opposed to each other so that the strip lines 31, 33 become electrically coupled, thereby forming a coupler. Further, the first and second ends of each of the strip lines 32, 34 are opposed to each other so that the strip lines 32, 34 become electrically coupled, thereby forming a coupler.

Likewise, the first and second ends of each of the strip lines 31, 35 are opposed to each other so that the strip lines 31, 35 become electrically coupled, thereby forming a coupler. Further, the first and second ends of each of the strip lines 32, 36 are opposed to each so that strip lines 32, 36 become electrically coupled, thereby forming a coupler.

The strip lines 31 and 32 are connected in series to form an unbalanced line, the strip lines 33 and 34 form a first balanced line, and the strip lines 35 and 36 form a second balanced line.

Further, resistors R1, R2 are electrically connected between the first balanced terminal 23*a* and the second balanced terminal 24*a*, and between the first balanced terminal 23*b* and the second balanced terminal 24*b*, respectively. The values of the resistors R1, R2 are each designed to be about ½ of the sum of the balanced line characteristic impedance value of the first balanced terminals 23*a*, 23*b* and the balanced line characteristic impedance value of the second balanced terminals 24*a*, 24*b*.

The balanced splitter 41 is an "unbalanced input/balanced output splitter" for splitting a single unbalanced signal into two balanced signals, and provides the same operation/effect as that of the balanced splitter 21 according to PREFERRED EMBODIMENT 1.

Preferred Embodiment 3

Figure 3:
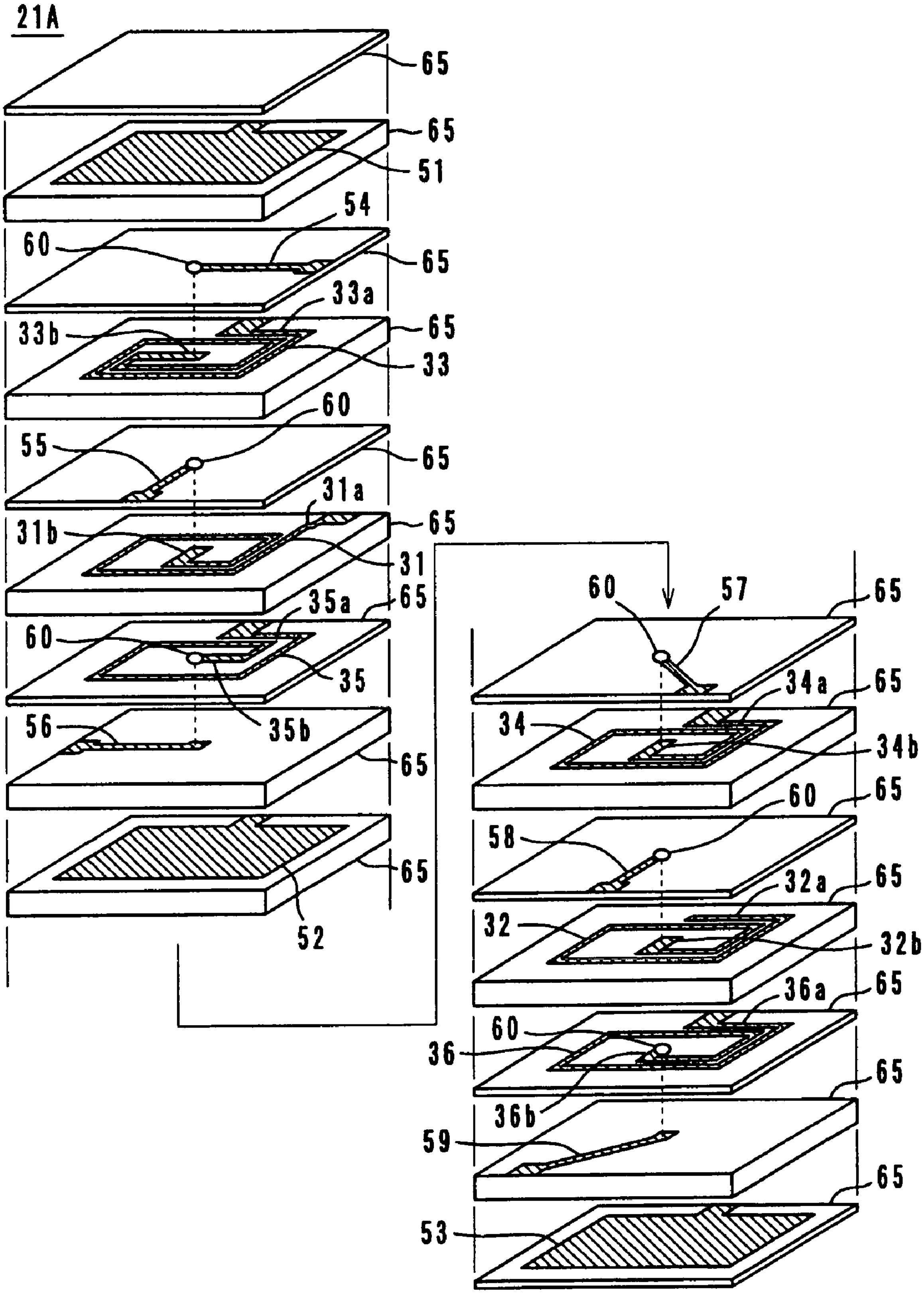
FIG. 3 is an exploded perspective view of a balanced splitter according to a third preferred embodiment of the present invention.

FIG. 3 is an exploded perspective view of a laminated balanced splitter 21A incorporating the balanced splitter 21 shown in FIG. 1. The balanced splitter 21A is composed of dielectric sheets 65 having ground electrodes 51, 52, 53 arranged on surfaces thereof; dielectric sheets 65 in which ¼ strip lines 31, 32, 33, 34, 35, 36 and inter-layer connecting via holes 60 are provided; dielectric sheets 65 in which extraction electrodes 54, 55, 56, 57, 58, 59 and the inter-layer connecting via holes 60 are provided; and an outer dielectric sheet 65 with no electrode.

As the material used for the dielectric sheets 65, dielectric ceramic powder kneaded with a binder, or the like, and formed into a sheet-like configuration is used. The strip lines 31 to 36 and the extraction electrodes 54 to 59 are formed by sputtering, vapor-deposition, printing, or the like, and are each made of a material such as Ag, Ag—Pd, or Cu. The inter-layer connecting via holes 60 are provided by forming a through-hole in the dielectric sheets 65 using a laser beam, or the like, and filling this through-hole with a conductive paste including Ag, Ag—Pd, or Cu by print coating, or the like.

With respect to the laminating direction of the dielectric sheets 65, the dielectric sheets 65 provided with the ground electrodes 51, 52, 53 are respectively arranged at upper, middle, and lower layer portions. The dielectric sheets arranged with the spiral-shaped strip lines 33, 35 sandwich the dielectric sheet arranged between the ground electrodes 51 and 52. It should be noted that while in PREFERRED EMBODIMENT 3 the dielectric sheets provided with the strip lines 33, 31, 35 are arranged in the stated order from the upper layer, the dielectric sheets provided with the strip lines 35, 31, 33 may be arranged in the stated order from the upper layer.

Likewise, the dielectric sheets arranged with the spiral-shaped strip lines 34, 36 thereof sandwich the dielectric sheet arranged with the spiral-shaped strip line 32 thereof, and are arranged between the ground electrodes 52 and 53. It should be noted that while in PREFERRED EMBODIMENT 3 the dielectric sheets provided with the strip lines 34, 32, 36 are arranged in the stated order from the upper layer, the dielectric sheets provided with the strip lines 36, 32, 34 may be arranged in the stated order from the upper layer. Further, the dielectric sheets provided with the strip lines 34, 32, 36 may be arranged above the dielectric sheet provided with the ground electrode 52, with the dielectric sheets provided with the strip lines 33, 31, 35 provided below the dielectric sheet provided with the ground electrode 52.

Each of the ground electrodes 51 to 53 is arranged over a large area of the surface of a dielectric sheet 65, with a portion thereof being exposed at the center of the rear edge of the sheet 65. The strip line 33 is arranged at the center of the dielectric sheet 65, and the first end 33*a* thereof is exposed at the center of the rear edge of the dielectric sheet 65. The second end 33*b* of the strip line 33 is extended to the right edge of the dielectric sheet 65 through the inter-layer connecting via hole 60 and the extraction electrode 54 provided on the layer immediately above.

The strip line 31 is arranged at the center of the dielectric sheet 65, and a first end 31*a* thereof is exposed on the right side of the rear edge of the dielectric sheet 65. The second end 31*b* of the strip line 31 is extended to the center of the front edge of the dielectric sheet 65 through the inter-layer connecting via hole 60 and the extraction electrode 55 provided on the layer immediately above. The strip line 35 is arranged at the center of the dielectric sheet 65, and the first end 35*a* thereof is exposed at the center of the rear edge of the dielectric sheet 65. The second end 35*b* of the strip line 35 is extended to the left edge of the dielectric sheet 65 through the inter-layer connecting via hole 60 and the extraction electrode 56 provided on the layer immediately below.

Further, the first ends 31*a*, 33*a* and the second ends 31*b*, 33*b* of the strip lines 31, 33 are opposed to each other so that the strip lines 31, 33 become electrically coupled with the dielectric sheet 65 being sandwiched therebetween, thereby forming a coupler. Likewise, the first ends 31*a*, 35*a* and the second ends 31*b*, 35*b* of the strip lines 31, 35 are opposed to each other so that the strip lines 31, 35 become electrically coupled with the dielectric sheet 65 being sandwiched therebetween, thereby forming a coupler.

Further, the strip line 34 is arranged at the center of the dielectric sheet 65, and the first end 34*a* thereof is exposed at the center of the rear edge of the dielectric sheet 65. The second end 34*b* of the strip line 34 is extended to the right side of the front edge of the dielectric sheet 65 through the inter-layer connecting via hole 60 and the extraction electrode 57 provided on the layer immediately above. The strip line 32 is arranged at the center of the dielectric sheet 65, and the first end 32*a* thereof is an open end. The second end 32*b* of the strip line 32 is extended to the center of the front edge of the dielectric sheet 65 through the inter-layer connecting via hole 60 and the extraction electrode 58 provided on the layer immediately above. The strip line 36 is arranged at the center of the dielectric sheet 65, and the first end 36*a* thereof is exposed at the center of the rear edge of the dielectric sheet 65. The second end 36*b* of the strip line 36 is extended to the left side of the front edge of the dielectric sheet 65 through the inter-layer connecting via hole 60 and the extraction electrode 59 provided on the layer immediately below.

Further, the first ends 32*a*, 34*a* and the second ends 32*b*, 34*b* of the strip lines 32, 34 are opposed to each other so that the strip lines 32, 34 become electrically coupled with the dielectric sheet 65 being sandwiched therebetween, thereby forming a coupler. Likewise, the first ends 32*a*, 36*a* and the second ends 32*b*, 36*b* of the strip lines 32, 36 are opposed to each other so that the strip lines 32, 36 become electrically coupled with the dielectric sheet 65 being sandwiched therebetween, thereby forming a coupler.

Figure 4:
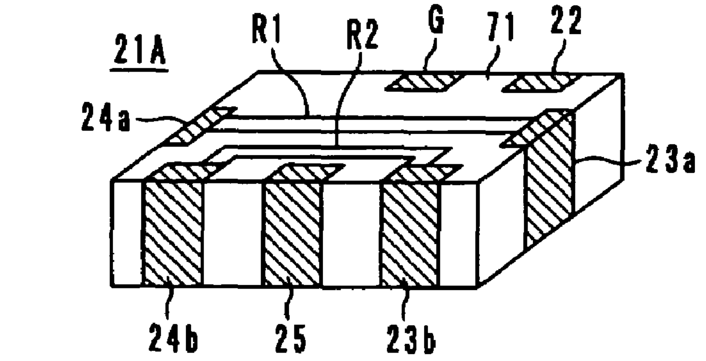
FIG. 4 is a perspective exterior view of the balanced splitter shown in FIG. 3.

The dielectric sheets 65 are laminated to one another and integrally fired to form a laminate 71 as shown in FIG. 4. A first balanced terminal 23*b*, a second balanced terminal 24*b*, and a relay terminal 25 are provided on the right side, on the left side, and at the center, respectively, of the front side surface of the laminate 71. An unbalanced terminal 22 and a ground terminal G are provided on the right side and at the center, respectively, of the rear side surface thereof. A first balanced terminal 23*a* is provided in the right side surface of the laminate 71, and a second balanced terminal 24*a* is provided in the left side surface thereof. Each of the terminals is arranged so as to extend from either side surface to the upper and lower surfaces.

The first balanced terminals 23*a*, 23*b* are electrically connected to the extraction electrodes 54, 57, respectively. The unbalanced terminal 22 is electrically connected to the first end 31*a* of the strip line 31, and the relay terminal 25 is electrically connected to the extraction electrodes 55, 58. The second balanced terminals 24*a*, 24*b* are electrically connected to the extraction electrodes 56, 59, respectively. The ground terminal G is electrically connected to a portion of the ground electrodes 51 to 53 and to the first ends 33*a*, 35*a*, 34*a*, 36*a* of the strip lines 33, 35, 34, 36.

Further, resistors R1, R2 are provided on the upper surface of the laminate 71 by printing a carbon paste, or the like. The resistor R1 provides electrical connection between the first balanced terminal 23*a* and the second balanced terminal 24*a*, and the resistor R2 provides electrical connection between the first balanced terminal 23*b* and the second balanced terminal 24*b*. It should be noted that the resistors R1, R2 may be provided on the bottom surface of the laminate 71. Further, the resistors R1, R2 may be chip resistors disposed on the surface of the laminate instead of printed resistors. Further, the resistors R1, R2 may be externally mounted to a printed board incorporating the balanced splitter 21A and be connected to the respective terminals through wiring.

The laminated balanced splitter 21A configured as described above allows easy adjustment of the electromagnetic coupling values between the strip lines 31-33, 31-35, 32-34, and 32-36 by changing the thickness of the dielectric sheet 65, or the like. Further, the strip lines 31 to 36 and the like are formed at the same time through the same manufacturing method, thereby making it possible to minimize variations in electromagnetic coupling characteristics occurring during the manufacture.

Further, the strip lines 33, 31, 35 are arranged above the ground electrode 52, and the strip lines 34, 32, 36 are arranged below the ground electrode 52, whereby the strip lines 33, 31, 35 and the strip lines 34, 32, 36 are shielded by the ground electrode 52. Accordingly, there is no electromagnetic coupling between the strip lines 33, 31, 35 and the strip lines 34, 32, 36, thereby making it possible to obtain broadband, low-loss characteristics.

Preferred Embodiment 4

Figure 5:
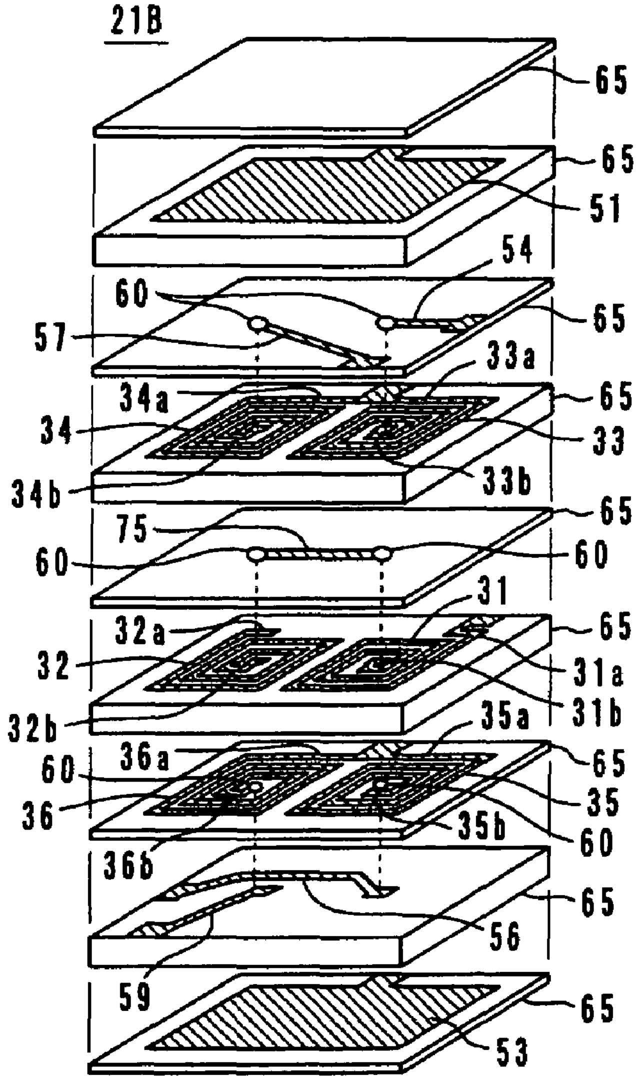
FIG. 5 is an exploded perspective view of a balanced splitter according to a fourth preferred embodiment of the present invention.

FIG. 5 is an exploded perspective view of a laminated balanced splitter 21B incorporating the balanced splitter 21 shown in FIG. 1. The balanced splitter 21B is composed of dielectric sheets 65 having ground electrodes 51, 53 provided on surfaces thereof, dielectric sheets 65 in which ¼ strip lines 31, 32, 33, 34, 35, 36 and inter-layer connecting via holes 60 are provided, dielectric sheets 65 in which extraction electrodes 54, 56, 57, 59 and the inter-layer connecting via holes 60 are provided, a dielectric sheet 65 in which a relay terminal 75 and the inter-layer connecting via hole 60 are provided, and an outer dielectric sheet 65 with no electrode.

With respect to the laminating direction of the dielectric sheets 65, the dielectric sheets 65 provided with the ground electrodes 51, 53 are arranged at upper and lower layer portions, respectively. Between the ground electrodes 51 and 53, there are arranged the dielectric sheet provided with the strip lines 31, 32 that are spiral-shaped, the dielectric sheet provided with the strip lines 33, 34 that are also spiral-shaped, and the dielectric sheet provided with the strip lines 35, 36 that are also spiral-shaped. It should be noted that while in PREFERRED EMBODIMENT 4 the dielectric sheets provided with the strip lines 33 and 34, 31 and 32, and 35 and 36 are arranged in the stated order from the upper layer, the dielectric sheets provided with the strip lines 35 and 36, 31 and 32, and 33 and 34 may be arranged in the stated order from the upper layer.

The strip lines 33 and 34 are respectively arranged in the right and left halves of the same dielectric sheet 65. Respective first ends 33*a*, 34*a* of the strip lines 33, 34 are connected to each other and exposed at the center of the rear edge of the dielectric sheet 65. The second end 33*b* of the strip line 33 is extended to the right edge of the dielectric sheet 65 through the inter-layer connecting via hole 60 and the extraction electrode 54 provided in the layer immediately above. The second end 34*b* of the strip line 34 is extended to the right side of the front edge of the dielectric sheet 65 through the inter-layer connecting via hole 60 and the extraction electrode 57 provided in the layer immediately above.

The strip lines 31 and 32 are respectively arranged in the right and left halves of the same dielectric sheet 65. The first end 31*a* of the strip line 31 is exposed on the right side of the rear edge of the dielectric sheet 65. The second end 31*b* of the strip line 31 is electrically connected to the second end 32*b* of the strip line 32 through the inter-layer connecting via hole 60 and the relay electrode 75 provided in the layer immediately above. The first end 32*a* of the strip line 32 is an open end.

Further, the first ends 31*a*, 33*a* and the second ends 31*b*, 33*b* of the strip lines 31, 33 are opposed to each other so that the strip lines 31, 33 become electrically coupled with the dielectric sheet 65 being sandwiched therebetween, thereby forming a coupler. Likewise, the first ends 32*a*, 34*a* and the second ends 32*b*, 34*b* of the strip lines 32, 34 are opposed to each other so that the strip lines 32, 34 become electrically coupled with the dielectric sheet 65 being sandwiched therebetween, thereby forming a coupler.

The strip lines 35 and 36 are respectively arranged in the right and left halves of the same dielectric sheet 65. Respective first ends 35*a*, 36*a* of the strip lines 35, 36 are connected to each other and exposed at the center of the rear edge of the dielectric sheet 65. The second end 35*b* of the strip line 35 is extended to the left edge of the dielectric sheet 65 through the inter-layer connecting via hole 60 and the extraction electrode 56 provided in the layer immediately below. The second end 36*b* of the strip line 36 is extended to the left side of the front edge of the dielectric sheet 65 through the inter-layer connecting via hole 60 and the extraction electrode 59 provided in the layer immediately below.

Further, the first ends 31*a*, 35*a* and the second ends 31*b*, 35*b* of the strip lines 31, 35 are opposed to each other so that the strip lines 31, 35 become electrically coupled with the dielectric sheet 65 being sandwiched therebetween, thereby forming a coupler. Likewise, the first ends 32*a*, 36*a* and the second ends 32*b*, 36*b* of the strip lines 32, 36 are opposed to each other so that the strip lines 32, 36 become electrically coupled with the dielectric sheet 65 being sandwiched therebetween, thereby forming a coupler.

Figure 6:
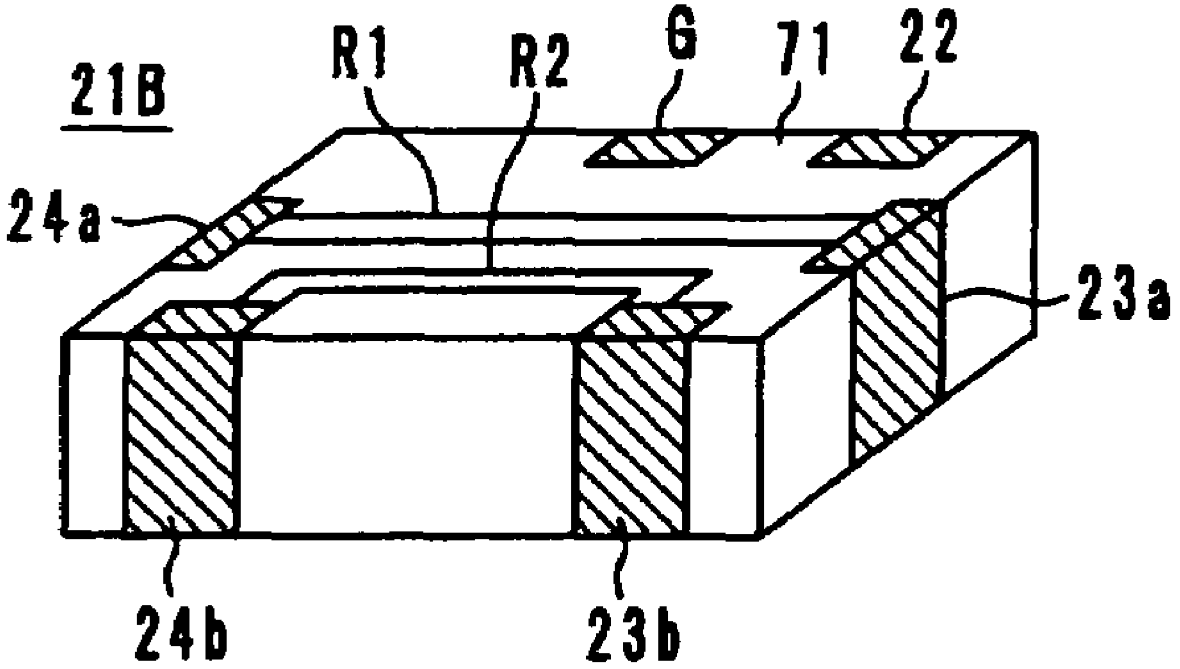
FIG. 6 is a perspective exterior view of the balanced splitter shown in FIG. 5.

The dielectric sheets 65 are laminated on top of one another and integrally fired to form a laminate 71 as shown in FIG. 6. A first balanced terminal 23*b*, a second balanced terminal 24*b*, and a relay terminal 75 (not shown in FIG. 6) are provided on the right side, on the left side, and at the center, respectively, of the front side surface of the laminate 71. An unbalanced terminal 22 and a ground terminal G are provided on the right side and at the center, respectively, of the rear side surface. A first balanced terminal 23*a* is provided in the right side surface of the laminate 71, and a second balanced terminal 24*a* is provided in the left side surface thereof. Each of the terminals is arranged so as to extend from either side surface to the upper and lower surfaces.

The first balanced terminals 23*a*, 23*b* are electrically connected to the extraction terminals 54, 57, respectively. The unbalanced terminal 22 is electrically connected to the first end 31*a* of the strip line 31. The second balanced terminals 24*a*, 24*b* are electrically connected to the extraction electrodes 56, 59, respectively. The ground terminal G is electrically connected to a portion of the ground electrodes 51, 53 and the first ends 33*a*, 34*a*, 35*a*, 36*a* of the strip lines 33, 34, 35, 36.

Further, resistors R1, R2 are provided on the upper surface of the laminate 71 by printing a carbon paste, or the like. The resistor R1 provides electrical connection between the first balanced terminal 23*a* and the second balanced terminal 24*a*, and the resistor R2 provides electrical connection between the first balanced terminal 23*b* and the second balanced terminal 24*b*. It should be noted that the resistors R1, R2 may be provided on the bottom surface of the laminate 71. Further, the resistors R1, R2 may be chip resistors disposed on the surface of the laminate instead of printed resistors. Further, the resistors R1, R2 may be externally mounted to a printed board incorporating the balanced splitter 21A and connected to the respective terminals through wiring.

The laminated balanced splitter 21B configured as described above allows-easy adjustment of the electromagnetic coupling values between the strip lines 31-33, 31-35, 32-34, and 32-36 by changing the thickness of the dielectric sheets 65, or the like. Further, the strip lines 31 to 36, and the like, are formed at the same time through the same manufacturing method, thereby making it possible to minimize variations in electromagnetic coupling characteristics occurring during the manufacture.

Further, the strip lines 31 and 32, 33 and 34, and 35 and 36 are arranged in the same sheet 65, whereby electromagnetic coupling occurs between the strip lines 31 and 32, 33 and 34, and 35 and 36. Therefore, narrowband, low-loss characteristics can be obtained.

Preferred Embodiment 5

There are cases where the laminated balanced splitter 21A, 21B according to PREFERRED EMBODIMENT 3 or PREFERRED EMBODIMENT 4 is used with the resistors R1, R2 externally mounted to a printer board including the balanced splitter 21A, 21B. In those cases, depending on the wiring pattern on the printed board connecting the strip lines 33, 34, 35, 36 and the resistors R1, R2, a delay may occur in the phase of the signal, resulting in a decrease in isolation between the first balanced terminals 23*a*, 23*b* and the second balanced terminals 24*a*, 24*b*.

Figure 7:
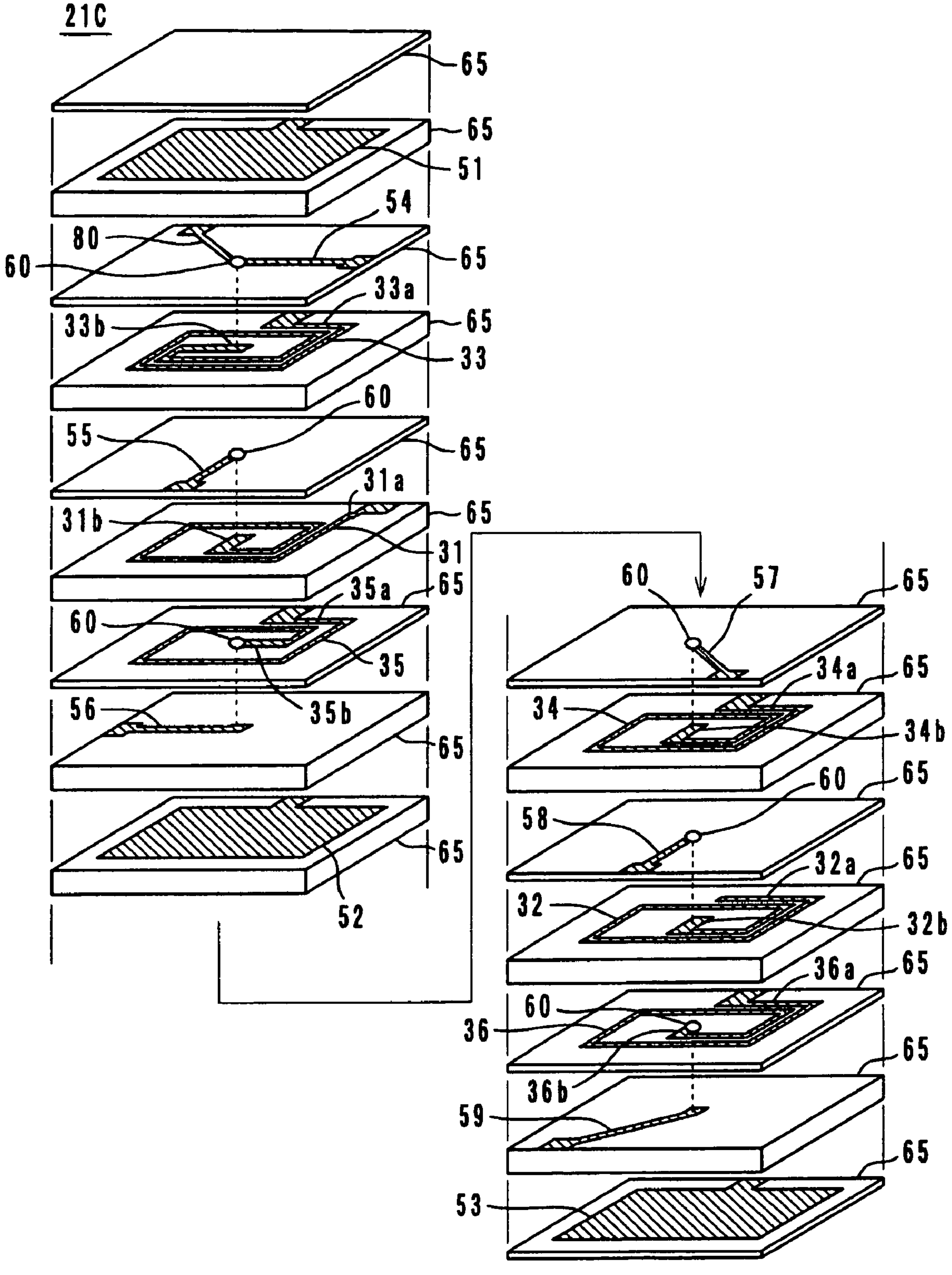
FIG. 7 is an exploded perspective view of a balanced splitter according to a fifth preferred embodiment of the present invention.
Figure 8:
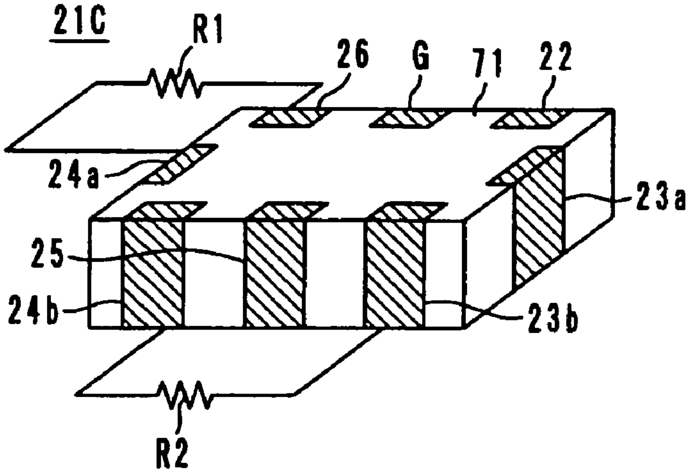
FIG. 8 is a perspective exterior view of the balanced splitter shown in FIG. 7.
Figure 9:
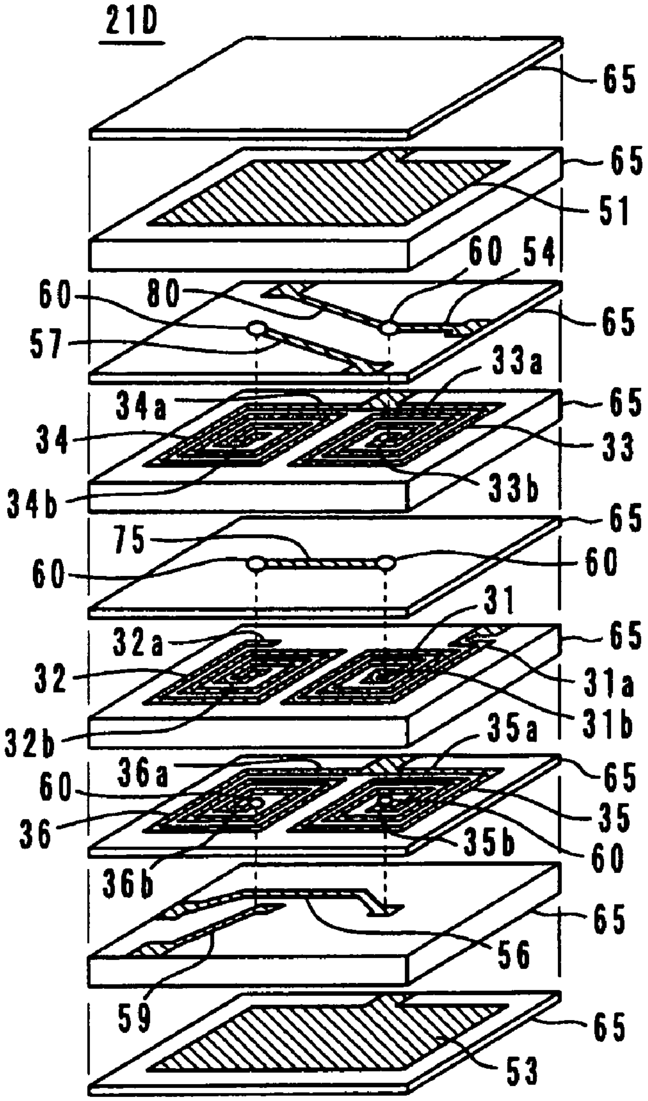
FIG. 9 is an exploded perspective view of a balanced splitter according to a modification of the fifth preferred embodiment of the present invention.
Figure 10:
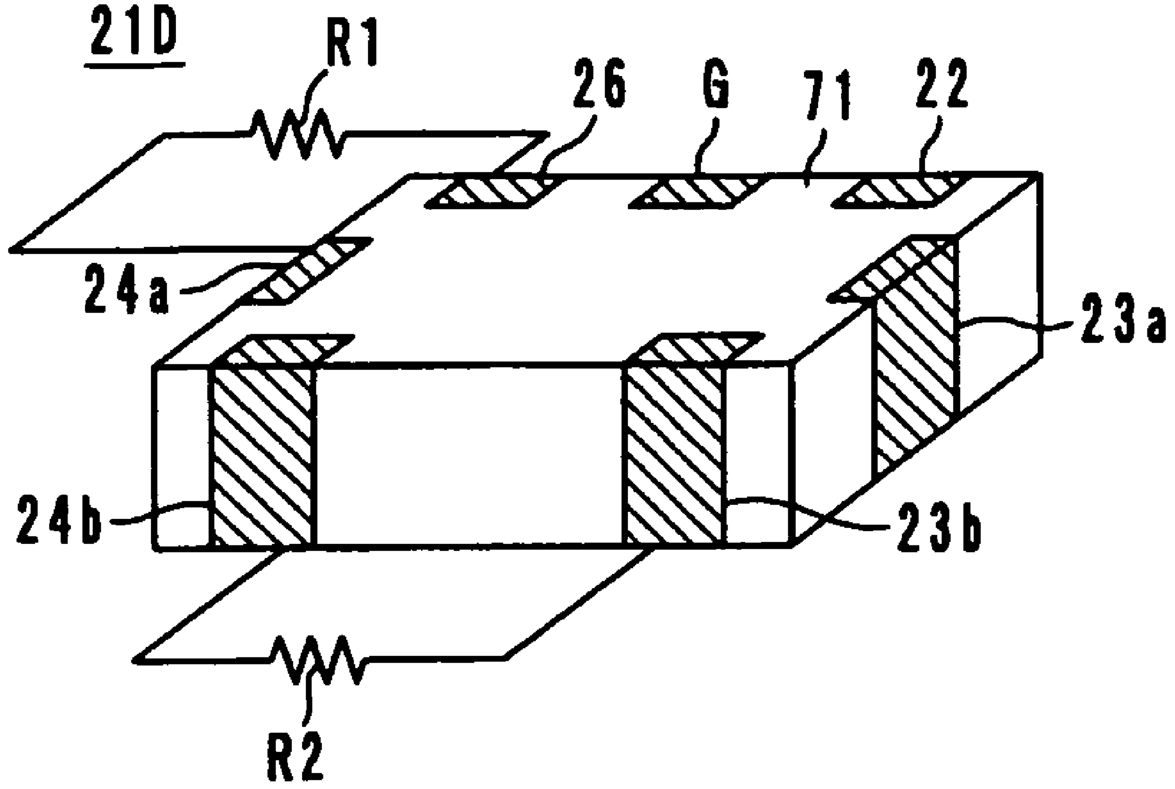
FIG. 10 is a perspective exterior view of the balanced splitter shown in FIG. 9.

A laminated balanced splitter according to PREFERRED EMBODIMENT 5 is designed to overcome this problem. A laminated balanced splitter 21C shown in FIGS. 7 and 8 represents a modification of the balanced splitter 21A according to PREFERRED EMBODIMENT 3. Further, a laminated balanced splitter 21D shown in FIGS. 9 and 10 represents a modification of the balanced splitter 21B according to PREFERRED EMBODIMENT 4.

The laminated balanced splitter 21C, 21D has, in the dielectric sheet 65 provided with the extraction electrode 54, a resistor-connecting-terminal extracting electrode 80 electrically connected to the extraction electrode 54, and has a resistor connecting terminal 26 electrically connected to the resistor-connecting-terminal extracting electrode 80, wherein the resistor connecting terminal 26 is arranged on the left side of the rear side surface of the laminate 71.

The resistor connecting terminal 26 connects to the resistor R1 and is arranged between the unbalanced terminal 22 and the second balanced terminal 24*a*. Further, the resistor-connecting-terminal extracting electrode 80 provides electrical connection between the extraction electrode 54 of the strip line 33 which is connected to the first balanced terminal 23 (from among the first balanced terminals 23*a*, 23*b*, that is not adjacent to the second balanced terminals 24*a*, 24*b*) and the resistor connecting terminal 26 which is provided at a position between the unbalanced terminal 22 and the second balanced terminal 24*a*. It should be noted that in the case where the extraction electrode 56 of the strip line 35 is connected to the first balanced terminal 23*a*, the resistor-connecting-terminal extracting electrode 80 provides electrical connection between the extraction electrode 56 and the resistor connecting terminal 26.

As described above, with the provision of the resistor connecting terminal 26 and the resistor-connecting-terminal extracting electrode 80, a delay in signal phase due to the wiring pattern on the printed board can be reduced to a minimum, thereby making it possible to minimize a reduction in isolation between the first balanced terminals 23*a*, 23*b* and the second balanced terminals 24*a*, 24*b*.

While in PREFERRED EMBODIMENT 5 the resistor connecting terminal 26 is arranged between the unbalanced terminal 22 and the second balanced terminal 24*a*, the resistor connecting terminal 26 may be arranged between the unbalanced terminal 22 and the first balanced terminal 23*a*. In this case, one of the extraction electrode 57 of the strip line 34 and the extraction electrode 59 of the strip line 36, and the resistor connecting terminal 26 are electrically connected to each other through the resistor-connecting-terminal extracting electrode 80.

It should be noted that a decrease in isolation between the first balanced terminals 23*a*, 23*b* and the second balanced terminals 24*a*, 24*b* can also be minimized, without the provision of the resistor connecting terminal 26, by printing the resistors R1, R2 onto the surface of the laminate 71 as described in PREFERRED EMBODIMENTS 3 and 4 or by mounting them to the laminate 71 as chip components.

Preferred Embodiment 6

Figure 11:
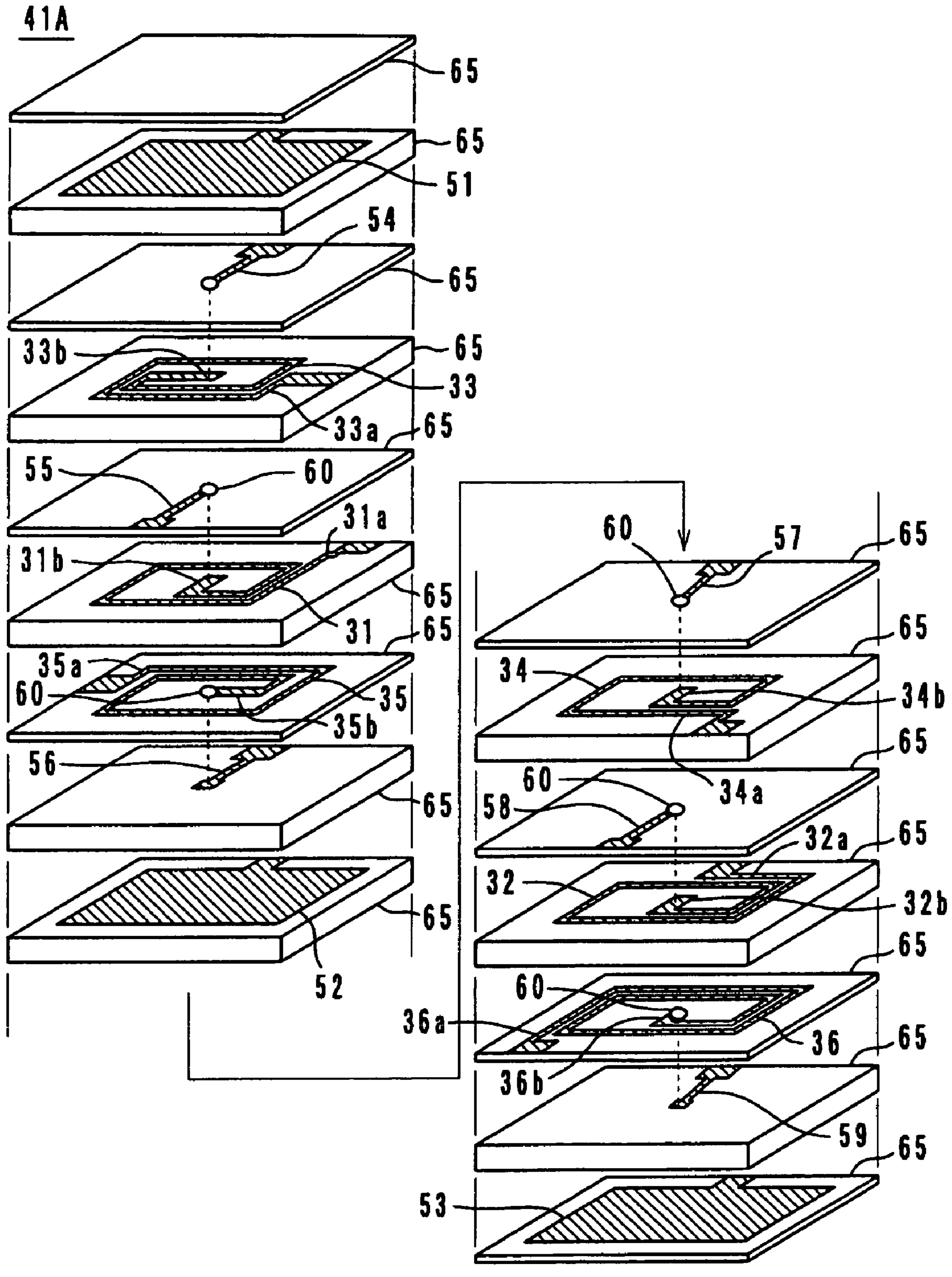
FIG. 11 is an exploded perspective view of a balanced splitter according to a sixth preferred embodiment of the present invention.

FIG. 11 is an exploded perspective view of a laminated balanced splitter 41A incorporating the balanced splitter 41 shown in FIG. 2. The balanced splitter 41A is composed of dielectric sheets 65 having ground electrodes 51, 52, 53 provided on surfaces thereof, dielectric sheets 65 in which ¼ strip lines 31, 32, 33, 34, 35, 36 and inter-layer connecting via holes 60 are arranged, dielectric sheets 65 in which extraction electrodes 54, 55, 56, 57, 58, 59 and the inter-layer connecting via holes 60 are arranged, and an outer dielectric sheet 65 with no electrode.

The ground electrodes 51 to 53 are each arranged over a large area of the surface of the dielectric sheets 65, and partially exposed at the center of the rear edge of the sheets 65. The strip line 33 is arranged at the center of the dielectric sheet 65, and the first end 33*a* thereof is exposed at the right edge of the dielectric sheet 65. The second end 33*b* of the strip line 33 is extended to the center of the rear edge of the dielectric sheet 65 through the inter-layer connecting via hole 60 and the extraction electrode 54 arranged in the layer immediately above.

The strip line 31 is arranged at the center of the dielectric sheet 65, and the first end 31*a* thereof is exposed on the right side of the rear edge of the dielectric sheet 65. The second end 31*b* of the strip line 31 is extended to the center of the front edge of the dielectric sheet 65 through the inter-layer connecting via hole 60 and the extraction electrode 55 arranged in the layer immediately above. The strip line 35 is arranged at the center of the dielectric sheet 65, and the first end 35*a* thereof is exposed at the left edge of the dielectric sheet 65. The second end 35*b* of the strip line 35 is extended to the center of the rear edge of the dielectric sheet 65 through the inter-layer connecting via hole 60 and the extraction electrode 56 arranged in the layer immediately below.

Further, the first ends 31*a*, 33*a* and the second ends 31*b*, 33*b* of the strip lines 31, 33 are opposed to each other so that the strip lines 31, 33 become electrically coupled with the dielectric sheet 65 being sandwiched therebetween, thereby forming a coupler. Likewise, the first ends 31*a*, 35*a* and the second ends 31*b*, 35*b* of the strip lines 31, 35 are opposed to each other so that the strip lines 31, 35 become electrically coupled with the dielectric sheet 65 being sandwiched therebetween, thereby forming a coupler.

Further, the strip line 34 is arranged at the center of the dielectric sheet 65, and first end 34*a* thereof is exposed on the right side of the front edge of the dielectric sheet 65. The second end 34*b* of the strip line 34 is extended to the center of the rear edge of the dielectric sheet 65 through the inter-layer connecting via hole 60 and the extraction electrode 57 arranged in the layer immediately above. The strip line 32 is arranged at the center of the dielectric sheet 65, and first end 32*a* thereof is an open end. The second end 32*b* of the strip line 32 is extended to the center of the front edge of the dielectric sheet 65 through the inter-layer connecting via hole 60 and the extraction electrode 58 arranged in the layer immediately above. The strip line 36 is arranged at the center of the dielectric sheet 65, and the first end 36*a* thereof is exposed on the left side of the front edge of the dielectric sheet 65. The second end 36*b* of the strip line 36 is extended to the center of the rear edge of the dielectric sheet 65 through the inter-layer connecting via hole 60 and the extraction electrode 59 arranged in the layer immediately below.

Further, the first ends 32*a*, 34*a* and the second ends 32*b*, 34*b* of the strip lines 32, 34 are opposed to each other so that the strip lines 32, 34 become electrically coupled with the dielectric sheet 65 being sandwiched therebetween, thereby forming a coupler. Likewise, the first ends 32*a*, 36*a* and the second ends 32*b*, 36*b* of the strip lines 32, 36 are opposed to each other so that the strip lines 32, 36 become electrically coupled with the dielectric sheet 65 being sandwiched therebetween, thereby forming a coupler.

Figure 12:
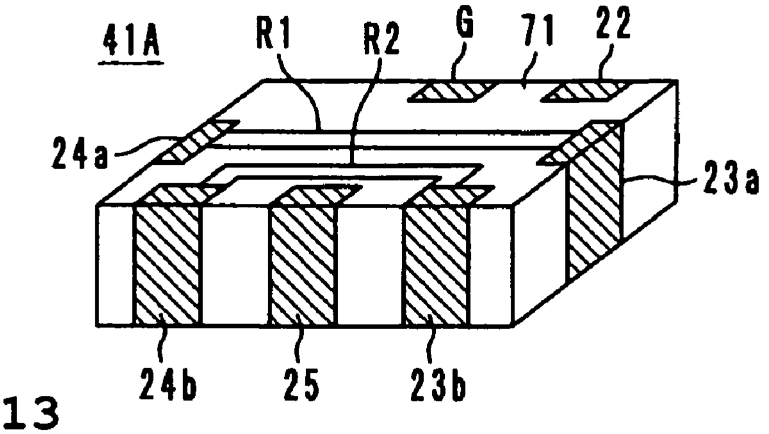
FIG. 12 is a perspective exterior view of the balanced splitter shown in FIG. 11.

The dielectric sheets 65 are laminated to one another and integrally fired to form a laminate 71 as shown in FIG. 12. A first balanced terminal 23*b*, a second balanced terminal 24*b*, and a relay terminal 25 are arranged on the right side, on the left side, and at the center, respectively, of the front side surface of the laminate 71. An unbalanced terminal 22 and a ground terminal G are arranged on the right side and at the center, respectively, of the rear side surface thereof. A first balanced terminal 23*a* is arranged in the right side surface of the laminate 71, and a second balanced terminal 24*a* is arranged in the left side surface thereof. Each of the terminals is arranged so as to extend from either side surface to the upper and lower surfaces.

The first balanced terminals 23*a*, 23*b* are electrically connected to the first ends 33*a*, 34*a* of the strip lines 33, 34, respectively. The unbalanced terminal 22 is electrically connected to the first end 31*a* of the strip line 31, and the relay terminal 25 is electrically connected to the extraction electrodes 55, 58. The second balanced terminals 24*a*, 24*b* are electrically connected to the first ends 35*a*, 36*a* of the strip lines 35, 36, respectively. The ground terminal G is electrically connected to a portion of the ground electrodes 51 to 53 and to the extraction electrodes 54, 56, 57, and 59.

Further, resistors R1, R2 are arranged on the upper surface of the laminate 71 by printing a carbon paste, or the like. The resistor R1 provides electrical connection between the first balanced terminal 23*a* and the second balanced terminal 24*a*, and the resistor R2 provides electrical connection between the first balanced terminal 23*b* and the second balanced terminal 24*b*. It should be noted that the resistors R1, R2 may be arranged on the bottom surface of the laminate 71. Further, the resistors R1, R2 may be chip resistors disposed on the surface of the laminate instead of printed resistors. Further, the resistors R1, R2 may be externally mounted to a printed board incorporating the balanced splitter 41A and be connected to the respective terminals through wiring.

The laminated balanced splitter 41A configured as described above provides the same effect as that of PREFERRED EMBODIMENT 3.

Other Preferred Embodiments

It should be noted that the present invention is not limited to the preferred embodiments described above but may accommodate various modifications within the scope of the present invention. In particular, the shape of the strip lines 31 to 36 is arbitrary and may be linear, spiral or serpentine. Further, the strip lines 31 to 36 may not necessarily be set to a length equal to or smaller than the ¼ wavelength.

Further, while in the above-described preferred embodiments the dielectric sheets having the strip lines, and the like, provided thereon are integrally fired after being laminated on top of one another, this is not to be construed as restrictive since the sheets may be fired in advance. Further, the laminated balanced splitter may be fabricated by the fabrication method as described below. That is, after forming a dielectric sheet by coating a paste-like dielectric material by printing or other such method, a paste-like conductive material is coated onto the surface of the dielectric layer to thereby form a strip line or electrode of an arbitrary shape. Then, the paste-like dielectric material is coated from above the strip line, or the like. Through such successive recoatings, a balanced splitter having a laminated structure can be obtained.

As described above, the preferred embodiments of the present invention are useful when applied to a balanced splitter of a mobile communication device, or the like, and proves particularly advantageous in that it is simple in circuit configuration and enables miniaturization.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A balanced splitter comprising:

an unbalanced line including a first strip line and a second strip line connected in series;

an unbalanced terminal electrically connected to the first strip line of the unbalanced line;

a first balanced line including a third strip line electromagnetically coupled to the first strip line, and a fourth strip line electromagnetically coupled to the second strip line;

a first balanced terminal including two terminals, a first and a second of the two terminals being electrically connected to the third strip line and the fourth strip line of the first balanced line, respectively;

a second balanced line including a fifth strip line electromagnetically coupled to the first strip line, and a sixth strip line electromagnetically coupled to the second strip line;

a second balanced terminal including two terminals, a first and a second of the two terminals being electrically connected to the fifth strip line and the sixth strip line of the second balanced line, respectively;

a first resistor electrically connected between the first balanced terminal connected to the third strip line and the second balanced terminal connected to the fifth strip line; and a second resistor electrically connected between the first balanced terminal connected to the fourth strip line and the second balanced terminal connected to the sixth strip line.

2. A balanced splitter comprising:

a first strip line having a first end and a second end;

a second strip line having a first and a second end, the second end being electrically connected to the second end of the first strip line;

an unbalanced terminal electrically connected to the first end of the first strip line;

a third strip line having a first end and a second end, the first end being electrically connected to a ground;

a fourth strip line having a first end and a second end, the first end being electrically connected to the ground;

a first balanced terminal including two terminals, a first and a second of the two terminals being electrically connected to the second end of the third strip line and the second end of the fourth strip line, respectively;

a fifth strip line having a first end and a second end, the first end being electrically connected to the ground;

a sixth strip line having a first end and a second end, the first end being electrically connected to the ground;

a second balanced terminal including two terminals, a first and a second of the two terminals being electrically connected to the second end of the fifth strip line and the second end of the sixth strip line, respectively;

a first resistor electrically connected between the second end of the third strip line and the second end of the fifth strip line; and a second resistor electrically connected between the second end of the fourth strip line and the second end of the sixth strip line; wherein the first end of the second strip line is an open end; and the first strip line and the third strip line are electromagnetically coupled to each other such that the first ends and the second ends thereof are opposed to each other, the first strip line and the fifth strip line are electromagnetically coupled to each other such that the first ends and the second ends thereof are opposed to each other, the second strip line and the fourth strip line are electromagnetically coupled to each other such that the first ends and the second ends thereof are opposed to each other, and the second strip line and the sixth strip line are electromagnetically coupled to each other such that the first ends and the second ends thereof are opposed to each other.

3. A balanced splitter comprising:

a first strip line having a first end and a second end;

a second strip line having a first end and a second end, the second end being electrically connected to the second end of the first strip line;

an unbalanced terminal electrically connected to the first end of the first strip line;

a third strip line having a first end and a second end, the second end being electrically connected to a ground;

a fourth strip line having a first end and a second end, the second end being electrically connected to ground;

a first balanced terminal including two terminals, a first and a second of the two terminals being electrically connected to the first end of the third strip line and the first end of the fourth strip line, respectively;

a fifth strip line having a first end and a second end, the second end being electrically connected to the ground;

a sixth strip line having a first end and a second end, the second end being electrically connected to the ground;

a second balanced terminal including two terminals, a first and a second of the two terminals being electrically connected to the first end of the fifth strip line and the first end of the sixth strip line, respectively;

a first resistor electrically connected between the first end of the third strip line and the first end of the fifth strip line; and a second resistor electrically connected between the first end of the fourth strip line and the first end of the sixth strip line; wherein the first end of the second strip line is electrically connected to the ground; and the first strip line and the third strip line are electromagnetically coupled to each other such that the first ends and the second ends thereof are opposed to each other, the first strip line and the fifth strip line are electromagnetically coupled to each other such that the first ends and the second ends thereof are opposed to each other, the second strip line and the fourth strip line are electromagnetically coupled to each other such that the first ends and the second ends thereof are opposed to each other, and the second strip line and the sixth strip line are electromagnetically coupled to each other such that the first ends and the second ends thereof are opposed to each other.

4. The balanced splitter according to claim 1, wherein the first, second, third, fourth, fifth, and the sixth strip lines are ¼ wavelength strip lines.

5. The balanced splitter according to claim 2, wherein the first, second, third, fourth, fifth, and the sixth strip lines are ¼ wavelength strip lines.

6. The balanced splitter according to claim 3, wherein the first, second, third, fourth, fifth, and the sixth strip lines are ¼ wavelength strip lines.

7. The balanced splitter according to claim 1, wherein a resistance value of the first resistor and a resistance value of the second resistor are each about ½ of the sum of a balanced line characteristic impedance value of the first balanced terminal and a balanced line characteristic impedance value of the second balanced terminal.

8. The balanced splitter according to claim 2, wherein a resistance value of the first resistor and a resistance value of the second resistor are each about ½ of the sum of a balanced line characteristic impedance value of the first balanced terminal and a balanced line characteristic impedance value of the second balanced terminal.

9. The balanced splitter according to claim 3, wherein a resistance value of the first resistor and a resistance value of the second resistor are each about ½ of the sum of a balanced line characteristic impedance value of the first balanced terminal and a balanced line characteristic impedance value of the second balanced terminal.

10. A balanced splitter comprising:

first, second, third, fourth, fifth, and sixth strip lines, and ground electrodes laminated on top of one another with intervening dielectric layers to define a laminate;

an unbalanced terminal, first and second balanced terminals, and a ground terminal extending to a surface of the laminate, the first balanced terminal and the second balanced terminal each including two terminals;

the unbalanced terminal is electrically connected to the first strip line of an unbalanced line including the first strip line and the second strip line connected in series;

a first terminal and a second terminal of the first balanced terminal electrically connected to the third strip line and the fourth strip line of a first balanced line, respectively, the first balanced line including the third strip line electromagnetically coupled to the first strip line, and the fourth strip line electromagnetically coupled to the second strip line;

a first and a second terminal of the second balanced terminal electrically connected to the fifth strip line and the sixth strip line of a second balanced line, respectively, the second balanced line including the fifth strip line electromagnetically coupled to the first strip line, and the sixth strip line electromagnetically coupled to the second strip line;

a first resistor electrically connected between the first balanced terminal connected to the third strip line and the second balanced terminal connected to the fifth strip line; and a second resistor electrically connected between the first balanced terminal connected to the fourth strip line and the second balanced terminal connected to the sixth strip line.

11. The balanced splitter according to claim 10, wherein with respect to a laminating direction of the dielectric layers, the ground electrodes are respectively arranged in an upper layer portion, a middle layer portion, and a lower layer portion of the laminate; the first, third, and fifth strip lines are arranged between the ground electrode in the upper layer portion and the ground electrode in the middle layer portion; and the second, fourth, and sixth strip lines are arranged between the ground electrode in the middle layer portion and the ground electrode in the lower layer portion.

12. The balanced splitter according to claim 10, wherein with respect to a laminating direction of the dielectric layers, the ground electrodes are respectively arranged in an upper layer portion, a middle layer portion, and a lower layer portion of the laminate; the second, fourth, and sixth strip lines are arranged between the ground electrode in the upper layer portion and the ground electrode in the middle layer portion; and the first, third, and fifth strip lines are arranged between the ground electrode in the middle layer portion and the ground electrode in the lower layer portion.

13. The balanced splitter according to claim 10, wherein the surface of the laminate is provided with an external terminal electrically connected to one of the first resistor and the second resistor.

14. The balanced splitter according to claim 10, wherein the first resistor and the second resistor are arranged on the surface of the laminate.

* * * * *